United States Patent
Villani et al.

(10) Patent No.: US 6,410,912 B1
(45) Date of Patent: Jun. 25, 2002

(54) METHOD FOR REDUCING VARIATIONS IN ARRAYS OF MICRO-MACHINED CANTILEVER STRUCTURES USING ION IMPLANTATION

(75) Inventors: Thomas Stephen Villani, Londonderry, NH (US); Lawrence A. Goodman, Plainsboro, NJ (US)

(73) Assignee: Sarnoff Corporation, Princeton, NJ (US)

(*) Notice: Subject to any disclaimer, the term of this patent is extended or adjusted under 35 U.S.C. 154(b) by 0 days.

(21) Appl. No.: 09/712,109

(22) Filed: Nov. 14, 2000

Related U.S. Application Data
(60) Provisional application No. 60/163,463, filed on Nov. 15, 1999.

(51) Int. Cl.[7] .............................................. G01D 18/00
(52) U.S. Cl. .............................. 250/252.1; 250/492.21
(58) Field of Search ....................... 250/252.1, 492.21, 250/338.1

(56) References Cited

U.S. PATENT DOCUMENTS

| | | |
|---|---|---|
| 3,699,334 A | 10/1972 | Cohen et al. |
| 5,677,090 A | 10/1997 | Murumoto et al. |
| 5,844,238 A | 12/1998 | Sauer et al. ................. 258/332 |
| 5,922,212 A | 7/1999 | Kano et al. |
| 6,249,001 B1 * | 6/2001 | Sauer et al. ............. 250/338.1 |

FOREIGN PATENT DOCUMENTS

| | | |
|---|---|---|
| EP | 0 389 198 | 9/1990 |
| JP | 64-10140 | 1/1989 |

OTHER PUBLICATIONS

PCT International Search Report, Mar. 14, 2001.

* cited by examiner

*Primary Examiner*—Bruce Anderson
(74) *Attorney, Agent, or Firm*—William J. Burke

(57) ABSTRACT

A method of adjusting the position of a micro-mechanical bi-material cantilever is provided. The bi-material includes a first and a second material and each material has a corresponding thermal expansion coefficient. The method includes implanting ions predominantly into one material of the bi-material to modify internal stress in one of the first and second materials relative to the other material. The deformation of the bi-material is then detected to modulate the implantation of ions thereto.

14 Claims, 2 Drawing Sheets

METHOD FOR REDUCING VARIATIONS IN ARRAYS OF MICRO-MACHINED CANTILEVER STRUCTURES USING ION IMPLANTATION

CROSS-REFERENCE TO RELATED APPLICATIONS

This application claims the benefit of U.S. Provisional Application No. 60/165,463, filed Nov. 15, 1999, the contents of which are incorporated herein by reference.

BACKGROUND OF THE INVENTION

The invention relates to a method of adjusting the position of a micro-mechanical bi-material cantilever during manufacture. More particularly, the invention relates to implanting ions into the bi-material to modify internal stress of at least one material of the bi-material to adjust the position of the cantilever.

Ion implantation is widely utilized for controlling electrical characteristics in semiconductor devices during the impurity doping process. Ion implantation may also be utilized to reduce stress in thin films. In the semiconductor fabrication industry in particular, the importance of low stress in thin films is great as it impacts the reliability of the semiconductor device. After deposition of the film, ion implantation may be used to alter the internal stress and change the stress gradients in the conductive and/or dielectric layers of the film.

Recently, micro-mechanical bi-material cantilever sensors have been developed. These devices include a cantilever beam which bends, or deflects, when infrared radiation is absorbed by an infrared responsive absorber element of the beam. The infrared radiation heats the bi-material section of cantilever beam, thereby urging one of the bi-materials to expand at a greater rate than the other bi-material (i.e., as each material has a different thermal expansion coefficient), causing the cantilever to deflect, or bend with respect to a substrate of the sensor. The corresponding change in capacitance between the cantilever and the substrate, produces a signal that is used to measure the amount of radiation incident thereto.

The signal is detected by an arrangement of a fixed reference capacitor and the variable cantilever capacitor forming a charge divider which, when sampled, forms a voltage that is proportional to the cantilever capacitance.

Yet, difficulties have arisen in fabricating stress free layers uniformly and predictably to form the structure of the micro-mechanical bi-material cantilever sensor. The sensor's design is based on the assumption that arrays of identical cantilevers can be formed with two thin film layers having different thermal expansion coefficients. The performance of the sensor is determined in part by the position of the cantilever beam relative to the substrate. This bi-material structure is intended to change its position as its temperature changes. However, the initial position depends upon the relative stress of the cantilever beam (and stress gradients). The thin films used are difficult to control accurately by deposition parameters, as can be appreciated, producing cantilever beam structures of uniform initial position is also difficult.

Accordingly, there is a need for a method to predictably form and/or calibrate micro-mechanical bi-material cantilever sensors such that cantilever beams can be uniformly and predictably positioned.

SUMMARY OF THE INVENTION

The present invention provides a method of adjusting the position of a micro-mechanical bi-material cantilever. The bi-material portion of the device includes a first and second material and each material has a corresponding thermal expansion coefficient. The method includes modifying internal stress of the first material relative to the second material by implanting ions to the first material. The position of the bi-material is monitored to modulate the dosage of implanted ions.

According to one aspect of the invention, a method of calibrating an array of micro-mechanical bi-material cantilever sensors with an ion beam is provided. Internal stress of at least one material of the bi-material is modified by the ion beam to adjust the position of the cantilever relative to a corresponding substrate material of each sensor of the array.

According to another aspect of the invention, a method of calibrating an array of micro-mechanical bi-material cantilever capacitive sensors with an ion beam is provided. The sensors each providing a variable capacitance formed between the cantilever and a sensor substrate. Internal stress of at least one material of the bi-material is modified by implanting ions of the ion beam into the material to adjust the position of the cantilever relative to a corresponding substrate material of each sensor for adjusting the variable capacitance of each sensor.

BRIEF DESCRIPTION OF THE SEVERAL VIEWS OF THE DRAWINGS

The foregoing summary as well as the following detailed description of exemplary embodiments of the invention, will be better understood when read in conjunction with the appended drawings. For the purpose of illustrating the invention, there is shown in the drawings several exemplary embodiments of the invention. It should be understood, however, that the invention is not limited to the precise arrangements and instrumentalities shown. In the drawings.

DETAILED DESCRIPTION OF THE INVENTION

Figure 1:
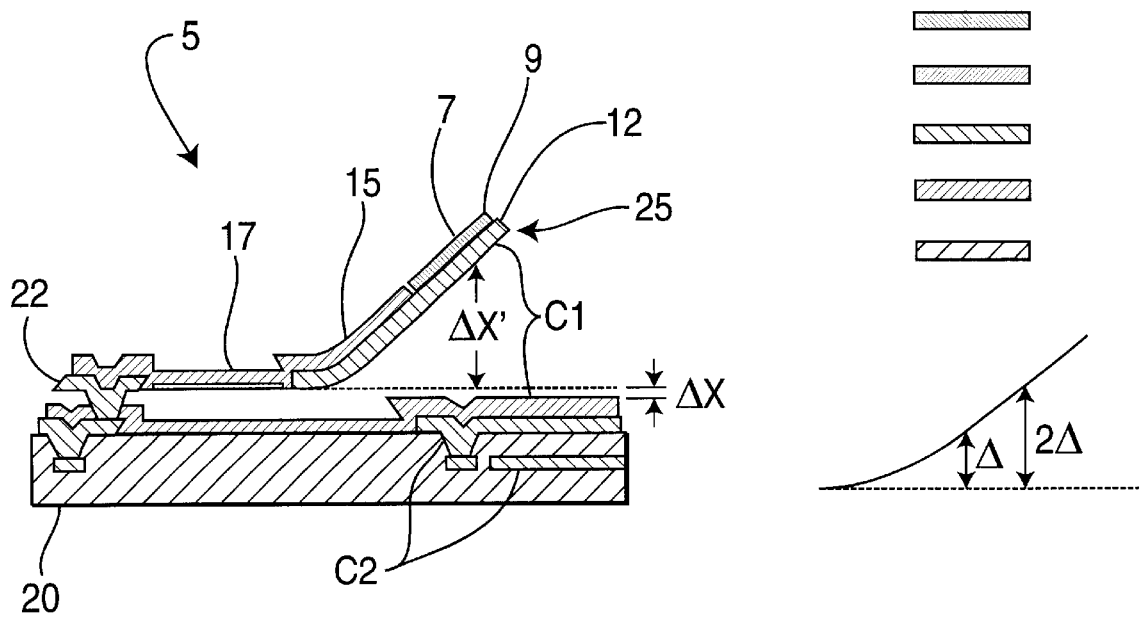
FIG. 1 illustrates a cross-section of a pixel showing the displacement of the capacitor C1 from an initial position.

Certain terminology is used herein for convenience only and is not to be taken as a limitation on the present invention. The term "micro-mechanical bi-material cantilever device" is defined as referring to any sensor device utilizing a heat deformable bi-material portion for converting broadband heat into a measurable. In the drawings, the same reference numerals are used for designating the same elements throughout the several figures.

This invention may be applied to single micro-mechanical bi-material cantilever devices or to micro-mechanical bimaterial devices that are arranged in an array. The array may be fabricated using a single-poly, double-level-metal CMOS process sequence, on which the capacitance sensor is then formed using planar deposition and etching techniques.

The present invention concerns a method of implanting ions into a material of a micro-mechanical bi-material cantilever to adjust its position relative to a substrate of the sensing device. The bi-material includes first and second materials and each material has a corresponding thermal expansion coefficient. The method includes implanting ions into the first material of the bi-material to modify internal stress of the first material relative to the second material or into the second material to modify its internal stresses relative to the first material. The position of the bi-material is then detected to modulate the implantation of ions thereto.

An ion implantation method is described herein for altering the stress (or stress gradient) in one of the two materials that constitute the bi-material. In particular, where the bi-material is a cantilever structure of a micro-mechanical sensor device the position of the cantilever relative to the substrate on which the sensor is formed may be adjusted by the ion implantation. As such, depending upon the polarity of the device, ion implantation can adjust the cantilever upwardly or downwardly with respect to the device substrate. For example, an implant of a uniform dose of ions can be applied to the entire array before releasing the cantilevers. Alternatively, it may be applied to each individual cantilever of an array in order to compensate for a poorly formed array device. Moreover, ion implantation in which the ion beam is modulated in intensity can scan an array of cantilever devices in order to alter the position of only the individual poorly formed cantilevers devices of the array. In this way, the overall uniformity in cantilever position of individual devices of the array is improved. When ion implantation is applied to the thin-film prior to releasing the cantilevers or when it is applied to the entire cantilever array, a broad-beam ion implantation device may be used. When ion implantation is applied to individual cantilever devices, however, it may be desirable to use a focused ion implantation device such that the ions are implanted into only one micro-cantilever device at a time.

The teachings of the present invention are described with reference to the micro-mechanical bi-material cantilever device 5 of FIG. 1 for the purpose of illustrating the invention. A capacitance C1 is formed between a cantilever beam, generally designated 25 and a substrate 20. A fixed capacitor value C2 is provided within the device 5 for use in providing a reference when processing the signal of C1 during excitation of the pixel. The device signal is detected by the arrangement of the reference capacitor C2 and the variable cantilever capacitor C1 forming a voltage divider which, when sampled, provides a voltage that is indicative of the position of the cantilever. The manufacturing techniques used to manufacture the device 5 include surface micro-machining steps as well as silicon IC processing which is compatible with, and transferable to standard silicon foundries.

A bi-material portion 15 of the micro-cantilever device 5 is formed of two different materials sharing a contiguous surface, and having mismatched thermal coefficients of expansion (TCE). The bi-material strip portion 15 is composed of a bottom layer and a top layer. One layer of the exemplary bi-material element is preferably silicon nitride or silicon carbide, having a much lower thermal coefficient of expansion than the second layer of the exemplary element, a metal such as aluminum or gold. Because the two layers are bonded to one another, strain is built up and the cantilever 25 bends, thereby moving the top plate of the capacitor C1. Thus, in operation, thermal energy deforms the bi-material portion 15, resulting in a deflection of the cantilever beam 25 ($\Delta X^1$) which causes a change in the capacitance C1. As the deflection increases, the space between the plates of capacitor C1 increase, thereby decreasing the capacitance. A distance or "thermal sensitivity" $\Delta X$ represents the initial distance between the cantilever 25 and substrate 20 absent excitation or "heating." It is recognized by those skilled in the art that the material utilized for the bottom and top layers can be interposed such that ion implantation into a desired material is possible. Furthermore, by adjusting the energy of the beam, ions may be predominantly implanted into either the top layer or the bottom layer of the bi-material element.

The cantilever beam 25 of the device or "pixel" includes three elements. An absorbing area 7 is formed from a photon absorbing material 9 which overlays an electrically conductive plate 12. The photon absorbing area 7 converts IR radiation into heat. The bi-material element 15 converts heat into mechanical movement and a thermally isolating support element 17 prevents heat from being shunted down to the device substrate 20 through cantilever anchor 22. The electrically conductive plate 12 may, for example, be aluminum, polysilicon or indium-tin oxide. Examples of such bi-material MEM micro-cantilever devices, thermal sensitivity, and methods for forming the same, are as disclosed in U.S. Pat. No. 5,844,238 issued to Sauer et al.

As described above, after the cantilevers are released, the plates of capacitor C1 of pixel device 5 are separated by an initial distance $\Delta X$. The initial distance $\Delta X$ depends highly on the relative stress of the cantilever beam 25 (and stress gradients). As can be appreciated, when arrays of devices are formed, variations in $\Delta X$ from one device to the next affect the overall reliability and performance of the array.

Figure 2:
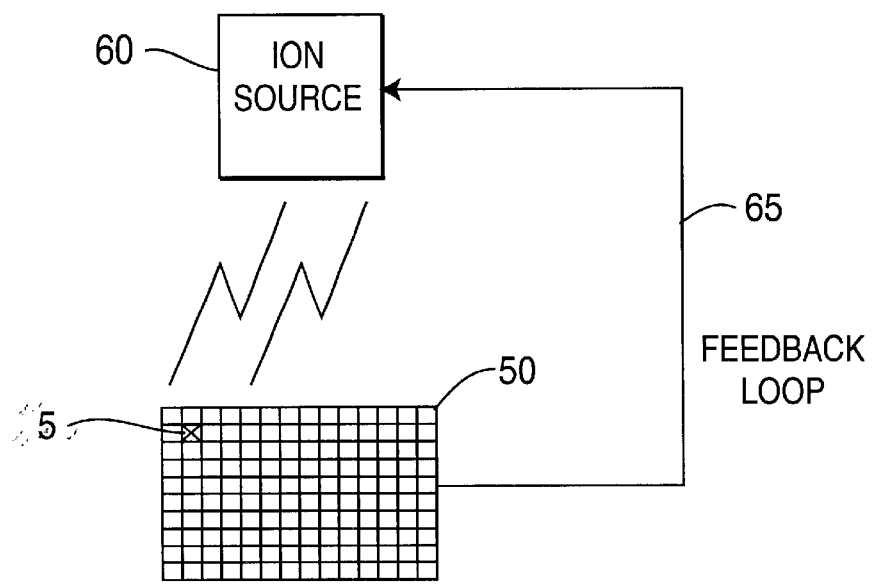
FIG. 2 is a block diagram of a ion implantation system in accordance with an embodiment of the present invention.

Referring now particularly to FIG. 2, a system and associated method in accordance with the present invention is shown for adjusting/calibrating the position of a released cantilever beam 25 relative to a substrate 20 of micro-mechanical bi-material cantilever devices. The system includes an array 50 of micro-mechanical bi-material cantilever devices, a focused ion implantation source 60 and an optional feedback loop 65.

The array 50 of micro-mechanical bi-material cantilever devices includes columns and rows of a plurality of individual pixels. The pixels provide proportionate electrical signals in response to heat, particularly infrared radiation incident thereto. Horizontal (row) and vertical (column) scanning registers (not shown) are typically used to address and read out the signal from each pixel to provide an output signal.

A ion implantation source 60 is shown for implanting ions into the top layer of the bi-material portion 15 of each device 5 in the usual manner. In one exemplary embodiment, arsenic and boron ions are utilized to alter the stress of the top layer of the bi-material.

In one embodiment, a broad-beam ion source is used to apply a uniform dose of ions (i.e., same number of ions per $cm^2$) to each device 5 of the array 50. This embodiment implants ions into the top layer of each corresponding bi-material portion 15. The uniform dosage of ions calibrates the distance $\Delta X$ of each pixel in the event of a poorly formed array by concurrently adjusting the thin film stress of all of the cantilevers 25 to alter their position in relation to the substrate 20. This embodiment is used to correct stresses that are substantially uniform across the array. It is recognized by those skilled in the art that a high energy ion implantation source may be utilized for implanting ions into the lower layer of the bi-material. Thus, depending upon the polarity of the device, the ion implantation adjusts the cantilever upwardly or downwardly with respect to the device substrate 20.

An alternative to this embodiment may be to use the broad-beam ion source to treat the thin-film layer before the micro-cantilever devices are released. In this embodiment, during formation of the array but before the devices are released, a few test micro-cantilever devices may be released and their stresses measured. Next, ion-implantation may be performed concurrently on the unreleased devices using a broad-beam ion source. This alternate method assumes that the test micro-cantilever devices fairly represent the stresses on the devices in the array.

In a further embodiment, a focused ion beam may be used to adjust the stresses in each cantilever of an array of released cantilever devices. According to this embodiment, a feedback loop 65 is provided between array 50 and ion implantation source 60 to provide feedback from the array 50 for modulating and/or controlling ion implantation. The focused ion beam may successively scan each pixel of the array 50 in order to calibrate the position of each cantilever 25 in relation to the substrate 20. The thin film stress of each cantilever 25 would receive a specific ion dosage in accordance with a feedback signal provided by the feedback loop 65. As can be appreciated, thermal distortion caused by the surrounding environment would impact the feedback signal, thus the array is desirably temperature controlled or cooled while this adjustment is made. In addition, the ions may cause the array to become electrically charged which may also cause errors in the feedback signal. To avoid the build-up of electrical charge, it may be desirable to employ an electron flood beam with the ion beam in order to neutralize any charge that may be imparted by the ion beam.

The feedback loop 65 may provide successive voltage values from the voltage divider formed by capacitors C1 and C2 for each pixel to adjust the ion implantation for each pixel in accordance with the detected value. Additionally, the ion implantation may be iteratively applied until the voltage value is between first and second predetermined values.

The ion dosage may be altered directly by the ion implantation source 60 by way of ion beam power or dwell time. In the embodiment, beam flux is preferably modulated between $1 \times 10^{15}$ ions per second and $9 \times 10^{15}$ ions per second and beam power is modulated between 25 KEV and 60 KEV.

Figure 3:
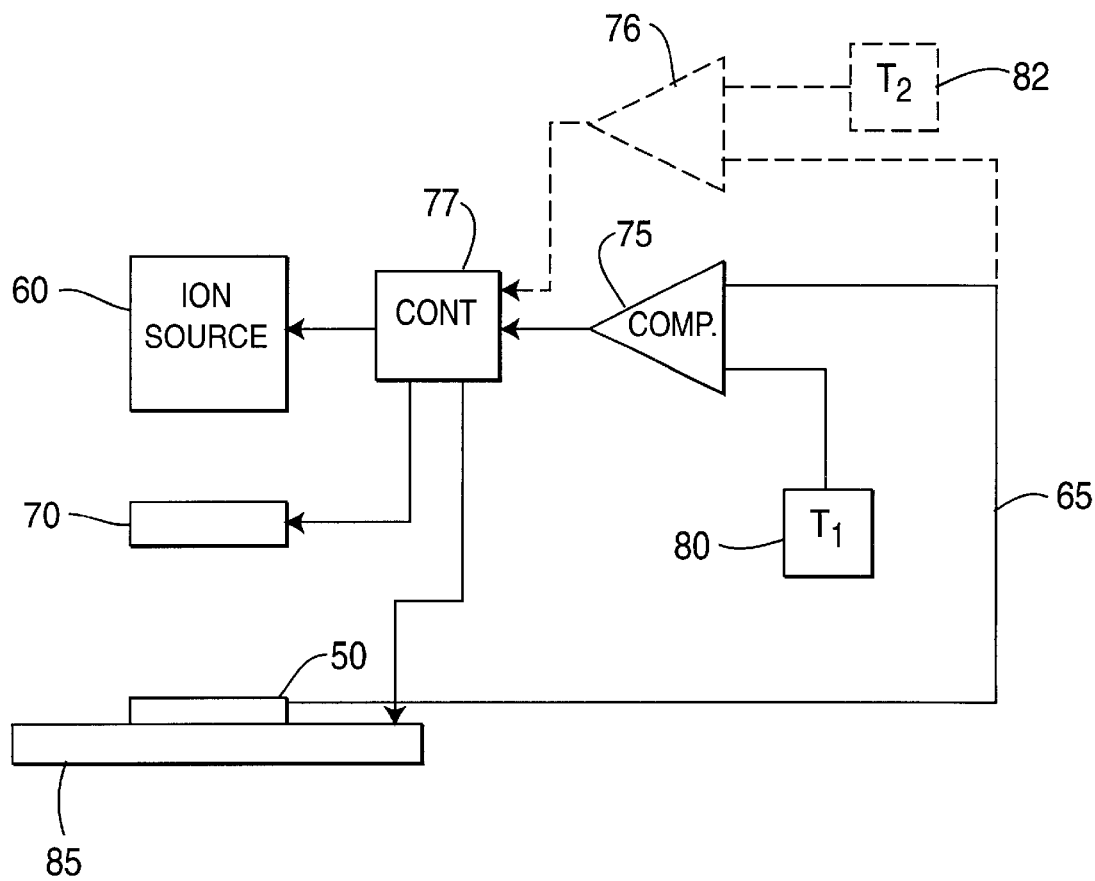
FIG. 3 is a block diagram of an ion implantation system in accordance with an embodiment of the invention.

Referring now to FIG. 3, a further system and associated method in accordance with the present invention is shown for adjusting/calibrating the position of cantilever beam of a pixel array 50. The system includes an ion implantation source 60, a shutter means 70, x-y translation table 85, feedback loop 65, a comparator 75 and a controller 77.

In operation, each array 50 is oriented by the x-y translation table 85 relative to the ion implantation source 60 for receiving ion implantation. The controller 77 controls the translation table 85 to position each sensor in the array directly in the path of the focused ion beam from source 60. During implantation, a signal is provided from feedback loop 65 through readout circuitry (not shown) to a comparator 75. Comparator 75 successively compares the feedback signal of each pixel of the array 50 to a predetermined threshold value ($T_1$) designated by block 80.

If the signal read from the display for a particular pixel is less than the predetermined value, the controller 77 actuates the ion source 60 and shutter 70 to selectively control the dwell time of the ion beam for the pixel. Thus, the implantation process is repeated until the feedback signal indicates that each pixel is at or above the desired threshold value.

The system shown in FIG. 3 may be modified by the addition of a second comparator 76 (shown in phantom). According to this modification, the controller 77 also controls the power of the ion beam to cause ions to be implanted predominantly into either the upper or lower materials of the bi-material element. In the embodiment described above, the beam has a predetermined power and flux. That apparatus implants ions only in one material (e.g. the upper material) of the bi-material element.

The modifications shown in phantom allow the system to adjust all of the cantilevers in the array to provide a relatively uniform output signal for a given stimulus. The comparator 75 and threshold value 80 operate in the same way as described above. The comparator 76 and threshold value 82, however, send a signal to the controller 77 when the signal provided by the array 50 for a particular cantilever is greater than the threshold value 82. In response to this signal, the controller 77 increases the power of the ion beam, causing it to implant ions into the lower material of the bi-material element. This causes the cantilever to bend in the opposite direction than if ions are implanted in the upper material.

In the exemplary embodiment of the invention, the ion beam is modulated to provide a relatively small dose to each pixel during each pass through the array. While the other pixels in the array are being processed, the dose applied to the one pixel stabilizes so that an accurate measurement of the position of the sensor may be made during the next pass through the array. This stabilization includes 1) an "annealing" of the ion-dosed bi-material, 2) damping of any oscillation in the cantilever that may have been induced by the implantation process during the previous pass through the array and 3) dissapation of any electrical charge that may have accumulated on the pixel during the previous pass.

It will be appreciated by those skilled in the art that changes could be made to the embodiments described above without departing from the broad inventive concept thereof. It is understood, therefore, that this invention is not limited to the particular embodiments disclosed, but is intended to cover modifications within the scope of the following claims.

What is claimed is:

1. A method of adjusting the position of a micromechanical bi-material cantilever, the bi-material including two materials, each material having a respectively different thermal expansion coefficient, the method comprising the steps of:

implanting ions into one material of the bi-material to modify internal stress of the one material relative to the other material; and detecting a position of the bi-material to modulate the implanting of the ions.

2. A method of calibrating an array of micro-mechanical bi-material cantilever sensors formed on a substrate, the method comprising:

implanting ions into at least one material of the bi-materials of selected ones of the bi-material cantilever sensors of the array; and monitoring respective output signals of the micromechanical bi-material cantilever sensors during implantation to modulate the ion implantation, whereby internal stress of the at least one material of at least one of the selected bi-material cantilever sensors is modified by the ion implantation to adjust the at least one selected bi-material cantilever sensor in its position relative to the substrate.

3. The method of calibrating an array of micromechanical bi-material cantilever sensors of claim 2, wherein the implanting of ions in at least one material of the bi-material of each sensor of the array uses a focused ion source and is performed for each sensor successively.

4. The method of calibrating an array of micromechanical bi-material cantilever sensors of claim 2, wherein the output signal of each sensor is provided successively to modulate the ion beam.

5. The method of calibrating an array of micro-mechanical bi-material cantilever sensors of claim 2, wherein the ion beam flux is modulated between $1\times10^{15}$ ions per second and $9\times10^{15}$ ions per second.

6. The method of calibrating an array of micro-mechanical bi-material cantilever sensors of claim 2, wherein the one material of the bi-materials is silicon carbide.

7. The method of calibrating an array of micro-mechanical bi-material cantilever sensors of claim 2, wherein the one material of the bi-materials is silicon nitride.

8. The method of calibrating an array of micro-mechanical bi-material cantilever sensors of claim 2, wherein the ion implantation step directs a focused ion beam at each sensor in the array and the ion beam is modulated by altering a dwell time of the beam with respect to each sensor.

9. A method of calibrating an array of micro-mechanical bi-material cantilever capacitive sensors, the sensors each providing a variable capacitance, the variable capacitance formed between the cantilever and a sensor substrate, the method comprising:

implanting ions from an ion beam into at least one material of the bi-material of selected cantilever capacitive sensors of the array;

monitoring respective variable capacitive values of the micro-mechanical bi-material cantilever capacitive sensors during implantation;

modulating the ion beam in accordance with the respective variable capacitive values of the micro-mechanical bi-material cantilever capacitive sensors, whereby internal stress of the at least one material of the bi-material is modified by the ion beam to adjust the position of the cantilever relative to the substrate for each selected sensor and, so, to adjust the variable capacitance of each selected cantilever capacitive sensor.

10. The method of calibrating an array of micro-mechanical bi-material cantilever capacitive sensors of claim 9, wherein the ion beam is scanned across all of the bi-material cantilever capacitive sensors in the array and is modulated until the variable capacitance value of each bi-material cantilever capacitive sensor in the array is between first and second predetermined values.

11. An apparatus for calibrating an array of micro-mechanical bi-material cantilever sensors formed on a substrate, comprising:

an ion source for generating an ion beam;

a shutter operably linked to the ion source and responsive to a control signal for selectively blocking the ion beam;

positioning means for directing the ion beam to selected ones of the micro-mechanical bi-material cantilever sensors in the array;

a controller for monitoring respective output signals of the micro-mechanical bi-material cantilever sensors, for actuating the shutter to modulate the ion beam and for controlling the positioning means to direct the modulated ion beam toward at least one-selected bi-material cantilever sensor, whereby internal stress of the at least one material of the bi-material of the at least one selected bi-material cantilever sensor is modified by the ion beam to adjust the position of the at least one selected bi-material cantilever sensor relative to the substrate.

12. Apparatus according to claim 11 further comprising:

a comparator which compares the output signal of the at least one selected bi-material cantilever sensor to a predetermined threshold value and provides an output signal to the controller;

wherein the controller, responsive to the output signal of the comparator, actuates the shutter to direct the ion beam toward one selected bi-material cantilever sensor when the respective output signal of the one selected bi-material cantilever sensor is less than the predetermined threshold value.

13. Apparatus according to claim 12, further comprising:

a further comparator which compares the output signal of the at least one selected bi-material cantilever sensor to a further predetermined threshold value and provides an output signal to the controller;

wherein the controller, responsive to the output signal of the further comparator, controls the ion beam in power to cause ions to be implanted in a lower material of the one selected bi-material cantilever sensor when the respective output signal of the one selected bi-material cantilever sensor is greater than the further predetermined threshold value.

14. A method for calibrating an array of micro-mechanical bi-material cantilever sensors to be formed on a substrate, comprising:

forming the array of micro-mechanical bi-material devices on the substrate but not releasing the devices from the substrate;

releasing at least one of the devices on the substrate to form a test device;

measuring a deflection of the test device to measure a level of stress in the array of micro-mechanical bi-material devices; and exposing each micro-mechanical bi-material device in the formed array of micro-mechanical bi-material devices to an ion source for an amount of time determined by the measured level of stress.

* * * * *